United States Patent [19]

Suzuki et al.

[11] 3,811,074

[45] May 14, 1974

[54] SEMICONDUCTOR DEVICE AND APPARATUS USING THE SAME

[75] Inventors: Toshimasa Suzuki; Yoshihiko Mizushima, both of Tokyo, Japan

[73] Assignee: Nippon Telegraph and Telephone Public Corporation, Tokyo, Japan

[22] Filed: Apr. 4, 1972

[21] Appl. No.: 240,999

[30] Foreign Application Priority Data

| | | |
|---|---|---|
| Apr. 10, 1971 | Japan | 46-22533 |
| Aug. 16, 1971 | Japan | 46-62186 |
| Aug. 16, 1971 | Japan | 46-62187 |
| Aug. 16, 1971 | Japan | 46-62188 |
| Sept. 14, 1971 | Japan | 46-71570 |

[52] U.S. Cl. .. 317/235 K, 317/235 C, 317/235 AB, 307/221 R, 307/221 D, 307/301, 307/299, 307/252 R

[51] Int. Cl. .... H01l 11/10

[58] Field of Search .... 307/221 R, 221 D, 301, 307/299, 252 R; 317/235 K, 235 C, 235 AB

[56] References Cited

UNITED STATES PATENTS

| | | | |
|---|---|---|---|
| 3,657,616 | 6/1973 | Mizushima | 317/235 R |
| 3,717,775 | 2/1973 | Kasperkovitz | 307/221 B |

*Primary Examiner*—Martin H. Edlow
*Attorney, Agent, or Firm*—Marshall & Yeasting

[57] ABSTRACT

A semiconductor device having a plurality of semiconductor elements formed in a monolithic manner in a semiconductor wafer of a first conductivity type while being sequentially arranged, in which each of the plurality of semiconductor elements consists of at least a collector region formed in the semiconductor wafer and having the first conductivity type and higher conductivity than the semiconductor wafer, a base region formed in the semiconductor wafer and having the first conductivity type and higher conductivity than the semiconductor wafer, and a relatively small emitter region formed in the semiconductor wafer between the base and collector regions and having a second conductivity type, at least the emitter region of each semiconductor element being adapted for exclusive use therewith and each semiconductor element presenting a current controlled negative resistance characteristic between the emitter and collector regions with a biasing power source being applied between the base and collector regions, and in which the distance between two adjacent ones of the semiconductor elements is selected so that when one of the two adjacent semiconductor elements is in the on state with the biasing power source being applied between the base and collector regions of the two semiconductor elements, the turnover voltage of the other semiconductor element may become low. A shift register, photoelectric conversion apparatus, logic functional circuit or apparatus and so on which employ such a semiconductor device.

18 Claims, 44 Drawing Figures

SEMICONDUCTOR DEVICE AND APPARATUS USING THE SAME

BACKGROUND OF THE INVENTION

1. Field of the Invention

This invention relates to a semiconductor device with a plurality of semiconductor elements having negative resistance characteristics and formed on semiconductor wafer on substrate in a monolithic manner and apparatus employing such a semiconductor device, and more particularly to such a semiconductor device and apparatus using the same which are applicable to functional circuits or apparatus such as a shift register, a delay line, a memory, an integrated logic circuit and the like, functional devices or apparatus such as a photoelectric conversion device for converting an optical image pattern into an electrical image pattern signal, a photosensitive device and the like.

2. Description of the Prior Art

In conventional types of shift registers employing a semiconductor device, the semiconductor device is usually formed with a plurality of individual bipolar transistors, MOS transistors or the combination thereof. Therefore, it is difficult to construct a large-capacity shift register with high density or compact and yield rate of its manufacture is likely to be low.

Recently, a charge-coupled semiconductor device has been proposed in which a plurality of MOS type semiconductor elements are formed closely spaced and in a monolithic manner on a semiconductor substrate. The charge-coupled semiconductor device is adapted so that charge is stored in the surface of one of the semiconductor elements and the stored charge is shifted to the other semiconductor elements one after another, thus providing a shift register function. In such a charge-coupled semiconductor device, however, the transfer efficiency of charge is less than unity but the stored charge is greatly attenuated when it is sequentially shifted. The shift speed of the charge depends upon the transfer efficiency thereof and a high speed operation is possible only at the expense of the transfer efficiency. Further, a lower limit of speed is imposed on signal processing because of utilization of the transient state of a conducting channel on the surface of a semiconductor substrate. Accordingly, a shift register employing such a prior art charge-coupled semiconductor device is obliged to employ complicated regenerating and recycling or refreshing circuits in order to overcome these defects.

SUMMARY OF THE INVENTION

One object of this invention is to provide a semiconductor device in which a plurality of semiconductor elements each having a negative resistance characteristic are formed on a semiconductor wafer or substrate and with which it is possible to construct a shift register free from the aforementioned defects encountered in the prior art.

Another object of this invention is to provide an improved semiconductor device with which it is possible to provide a high-speed shift register.

Another object of this invention is to provide an improved monolithic semiconductor device in which a plurality of semiconductor elements each having a negative resistance characteristic can be formed with high density on a semiconductor wafer or substrate together with other circuit elements without exerting any adverse effect on the operation of the device.

Another object of this invention is to provide an improved semiconductor device with which it is possible to make up a shift register whose shift action can be controlled externally.

Another object of this invention is to provide an improved semiconductor device with which it is possible to make up a logical function circuit easily.

Another object of this invention is to provide a photoelectric conversion apparatus employing the improved semiconductor device of this invention which converts an optical image pattern into an electrical image pattern signal.

Still another object of this invention is to provide a semiconductor logical function circuit or device employing the improved semiconductor device of this invention.

Other objects, features and advantages of this invention will become apparent from the following description taken in conjunction with the accompanying drawings.

DESCRIPTION OF THE PREFERRED EMBODIMENTS

Figure 1:
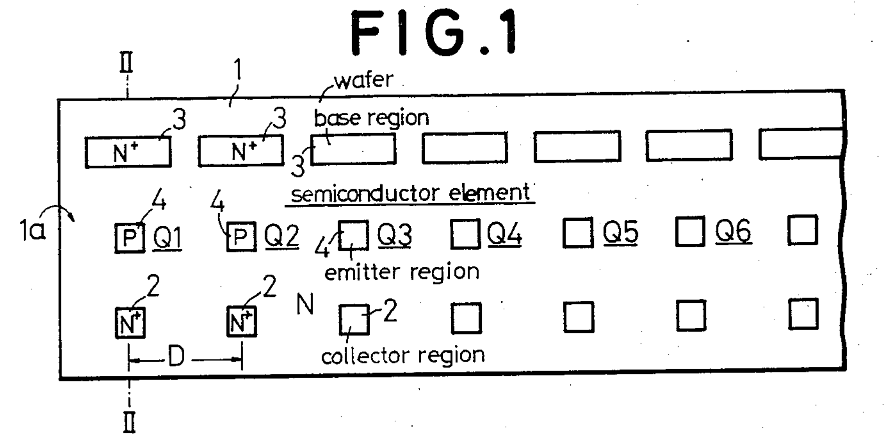
FIG. 1 is a schematic plan view showing one example of a semiconductor device according to this invention.
Figures 2, 3:
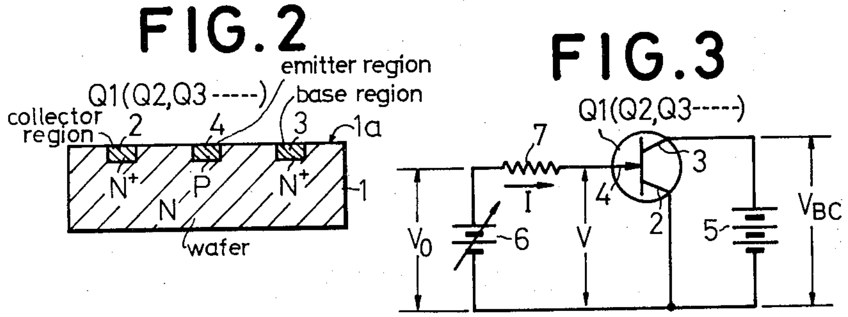
FIG. 2 is a cross-sectional view taken on the line II—II in FIG. 1.
FIG. 3 is a circuit diagram, for explaining the negative resistance characteristic of each semiconductor element of the semiconductor device shown in FIGS. 1 and 2.

With reference to FIGS. 1 and 2 a description will be given first of a semiconductor device of this invention. In the figures reference numeral 1 indicates generally a semiconductor wafer of a first conductivity type, for example, N-type conductivity, on which a plurality of semiconductor elements Q1, Q2, . . . are sequentially formed in its lengthwise direction. Each of the plurality of semiconductor elements Q1, Q2, . . . consists of relatively small collector region having the same conductivity type as the wafer 1 and higher conductivity than the latter, a base region 3 formed in opposing relation to the collector region 2 and having the same conductivity type as the wafer 1 and higher conductivity than the latter and an emitter region 4 formed between the collector and base regions 2 and 3 and having a second conductivity type, that is, P-type conductivity. The collector, base and emitter regions 2, 3 and 4 of each semiconductor element are adapted for exclusive use therewith.

The wafer 1 is formed of, for example, monocrystalline silicon having an impurity, for example, phosphorus, and a resistivity of 100 Ω cm. The collector regions 2 are formed by diffusing an N-type impurity, for example, phosphorus into the wafer 1 from its main surface 1*a* and have a high impurity concentration of, for example, about $10^{20}$ atoms/cm$^3$ as indicated by $N^+$ and are for example, 10 microns long, 10 microns wide and 2 microns deep. The base regions 3 are similarly formed by diffusing an N-type impurity, for example, phosphorus into the wafer 1 and have a high impurity concentration of, for example, about $10^{20}$ atoms/cm$^3$ and have a length of 10 microns, a width of 20 microns and a depth of 2 microns. The emitter regions 4 are formed by diffusing a P-type impurity, for example, boron into the wafer 1 from the main surface 1*a* and have an impurity concentration of, for example, about $10^{18}$ atoms/cm$^3$ and are, for example, 10 microns long, 10 microns wide and 3 microns deep. Each triad of the collector, base and emitter regions 2, 3 and 4 are aligned in the widthwise direction of the wafer 1 and the distances between the centers of the regions 2 and 4 and between those of the regions 4 and 3 are selected to be 20 microns respectively.

The plurality of semiconductor elements Q1, Q2, . . . are similar in mechanism with a known unijunction transistor. Accordingly, each of the semiconductor elements Q1, Q2, . . . generally presents a current controlled negative resistance characteristic. Each of the semiconductor elements Q1, Q2, . . . is represented by a symbol shown in FIG. 3, in which a constant bias voltage $V_{BC}$ is supplied between the collector and base regions 2 and 3 from a DC power source 5 (the side of the base region 3 being positive) and a voltage $V_O$ is supplied between the collector and emitter regions 2 and 4 from a DC power source 6 through a resistor 7 of an appropriate resistance valve (the side of the emitter region 4 being positive). Measuring a current I flowing through the emitter region 4 relative to the voltage V between the emitter and collector regions 4 and 2, the result is such a negative resistance characteristic as indicated by a curve 8 in FIG. 4.

Figure 4:
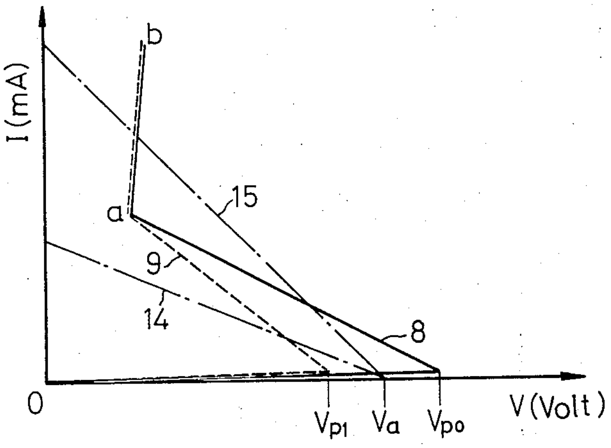
FIG. 4 is a graph showing the voltage-current characteristic presenting the negative resistance characteristic of each semiconductor device.

The reason why each semiconductor element presents such a negative resistance characteristic is that the conductivity between the emitter and collector regions 4 and 2 is modulated with minority carriers injected therebetween from the side of the emitter region 4, as is the case with the known unijunction transistor. In the illustrated example, however, since the collector region 2 is formed very small, accumulation of the minority carriers is caused in the neighborhood of the collector region 4 to make the negative resistance characteristic more steep. In the event that the wafer 1 and the collector, base and emitter regions 2, 3 and 4 making up each semiconductor element have the aforesaid numerical values and the bias voltage $V_{BC}$ is 5 volts, the turnover voltage or peak voltage of the negative resistance characteristic of each element is, for example, 2.5 volts under a condition that no carrier is injected between the regions 2 and 4 from the outside as will be described later on. In FIG. 4 reference character $V_{p0}$ indicates the turnover voltage under such a condition. While each element is in the on state, that is, in a state between points *a* and *b* on the curve 8, a lot of holes and electrons exist in a plasmatic form between the collector and emitter regions 2 and 4. Some of the holes and/or electrons are sufficiently spread outwardly from between the collector and emitter regions 2 and 4 and well distributed over a wide range. When the carriers are injected between the collector and emitter regions 2 and 4 or in the neighborhood thereof from the outside, the turnover voltage of each element becomes lower than the value $V_{p0}$. In FIG. 4 a curve 9 shows a typical negative resistance characteristic of each element in the above case and reference character $V_{p1}$ indicates its turnover voltage.

The distance D between adjacent ones of the semiconductor elements Q1, Q2, . . . is determined in the following manner. This will be described in connection with the distance D between the elements Q1 and Q2 for the sake of simplicity. Namely, the distance D is selected such that the turnover voltage of the element Q2 while the element Q1 is in the on state becomes $V_{p1}$ sufficiently lower than $V_{p0}$ owing to the fact that one part of carriers produced between the emitter and collector regions 4 and 2 of the element Q1 is injected between or in the vicinity of the emitter and collector regions 4 and 2 of the element Q2. For example, where the elements are thirteen in all, the distances D between adjacent ones of them are selected such that when the element Q7 is in the on state, the turnover voltages of the elements Q6 and Q8 may be $V_{p1}$ much lower than $V_{p0}$. When the wafer 1 and the collector, base and emitter regions 2, 3 and 4 making up each element have the aforesaid numerical values, the distance D is selected for example, 30 microns. In such a case, when $V_{BC}$ is, for example, 5 volts and an emitter current of the element Q7 is 0.5mA, $V_{p1}$ is, for example, 1.5 volts. In the case where the element Q7 is in the on state, the turnover voltages of the elements Q6 and Q8 lower from $V_{p0}$ to $V_{p1}$ as above described and the turnover voltages of the elements Q5 and Q9 also lower to $V_{p2}$ with a relation $V_{p0} > V_{p2} > V_{p1}$. In the case of using the above numerical value, $V_{p2}$ is 2.3 volts.

Figure 6:
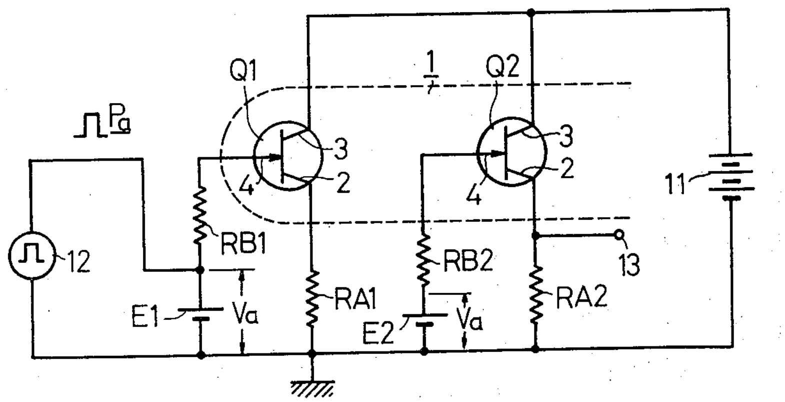
FIG. 6 is a circuit diagram, for explaining the operation of the semiconductor device exemplified in FIG. 1.

Using the semiconductor device of this invention for constructing a circuit as shown in FIG. 6 the following operation can be obtained. This will be described only in connection with the elements Q1 and Q2 for the sake of brevity. As shown in FIG. 6, the base regions 3 of the elements Q1 and Q2 are connected to the positive side of a DC bias power source 11 grounded at the negative side, while the collector regions 2 of the elements Q1 and Q2 are grounded through resistors RA1 and RA2 respectively. The emitter regions 4 of the elements Q1 and Q2 are connected respectively through resistors RB1 and RB2 to the positive sides of DC power sources E1 and E2 which are grounded at the negative sides and from which voltages Va are derived. In this case, the values of the voltages Va derived from the DC power sources E1 and E2 are selected such that $V_{p0}$ Ω $V_a$ Ω $V_{p1}$ with a relation to the turnover voltages $V_{p0}$ of the elements Q1 and Q2. Between the connection point of the resistor RB1 with the power source E1 and ground there is connected a pulse source 12 which derives a pulse P*a* of a voltage higher than the difference $(V_{p0} - V_a)$. An output terminal 13 is led out from the collector region 2 of the element Q2. With such an arrangement as shown in FIG. 6, the element Q1 is turned on with one pulse P*a* derived from the pulse source 12 (the side of the resistor RB1 being made positive). Consequently, the turnover voltage of the element Q2 lowers from $V_{p0}$ to $V_{p1}$, and hence is also turned on. In this case, by selecting the values of the resistors RB1, RB2, RA1 and RA2 to obtain load lines indicated by 14 and 15 in FIG. 4, the element Q2 remains in the on state even after the pulse P*a* becomes extinguished. When the pulse P*a* disappears, the element Q1 is turned off. If the values of the resistors RB1, RB2, RA1 and RA2 are so selected as to obtain the load line indicated by 14 in FIG. 4, the element Q2 is turned off together with the element Q1 when the pulse Pa becomes extinguished. Accordingly, the output terminal 13 derives therefrom outputs corresponding to the on and off states of the element Q2.

The semiconductor device of this invention depicted in FIGS. 1 and 2 can be used for making up a shift register in a manner similar to that described in connection with FIG. 8 later on. In this case, however, the base regions 3 of the elements Q1, Q2, . . . may well be interconnected.

Figure 7:
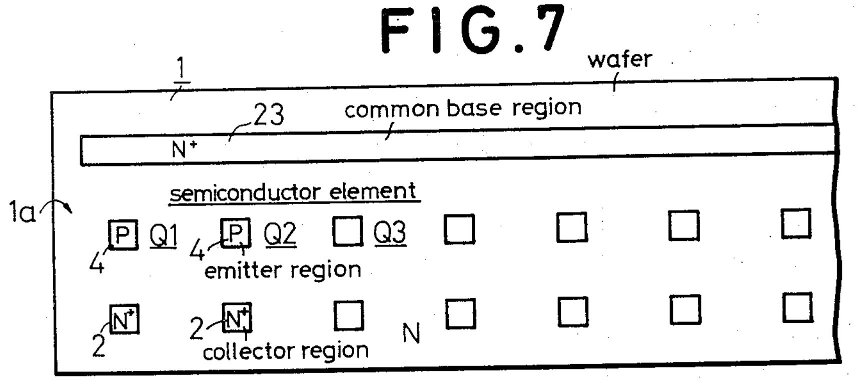
FIG. 7 is a plan view, similar to FIG. 1, showing another example of the semiconductor device of this invention.

FIG. 7 illustrates a modified form of the semiconductor device of this invention depicted in FIGS. 1 and 2. In the figure parts corresponding to those in FIGS. 1 and 2 are identified by the same reference numerals and characters and no detailed description will be repeated. The illustrated example is identical in construction with that of FIGS. 1 and 2 except in that the base regions 3 of the elements Q1, Q2, . . . in FIGS. 1 and 2 are replaced with a strip-like base region 23 which is formed to extend in the lengthwise direction of the wafer 1 in common to the elements Q1, Q2, . . . .

In the example of FIG. 7, each of the elements Q1, Q2, . . . is made up of a pair of the collector and emitter regions 2 and 4 and the common base region 23 and the collector and emitter regions 2 and 4 of each semiconductor element are adapted for exclusive use therewith. The common base region 23 performs the same function as that in the example of FIGS. 1 and 2. Accordingly, the semiconductor device depicted in FIG. 7 provides operational effects similar to those obtainable with the example of FIGS. 1 and 2.

Figure 8:
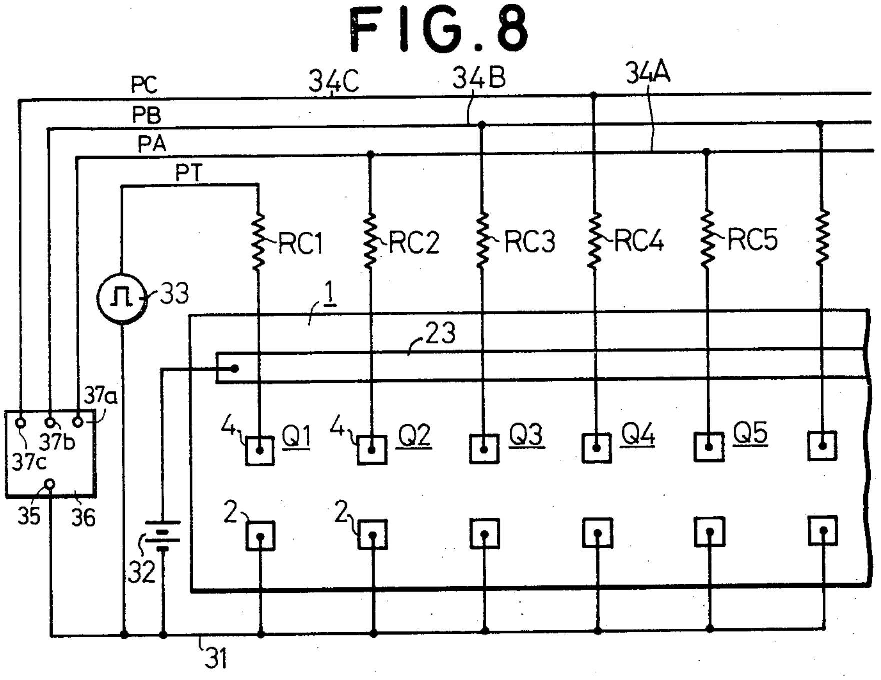
FIG. 8 illustrates one example of a circuit capable of providing a shift register function by the employment of the semiconductor device shown in FIG. 7.
Figure 9:
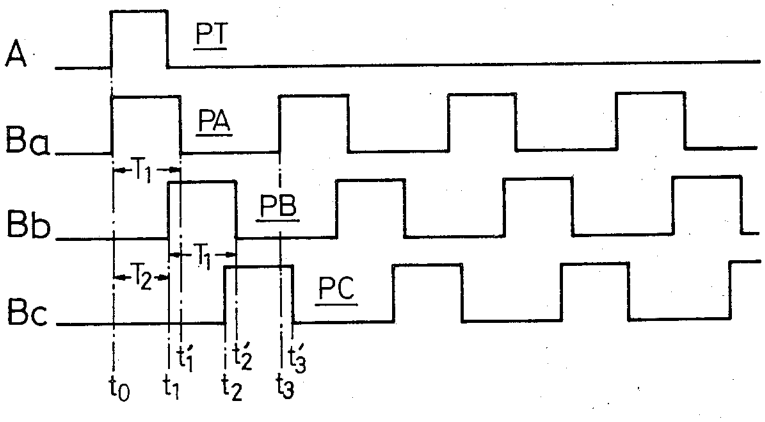
FIG. 9 shows signal waveforms for use with the circuit of FIG. 8.

FIG. 8 is a schematic circuit diagram showing a shift register formed with the semiconductor device according to this invention above described in connection with FIG. 7. The collector regions 2 of the elements Q1, Q2, . . . are connected to a line 31 in common thereto and a DC bias power source 32 with the side of the base region 23 being positive is connected between the line 31 and the common base region 23. Between the collector region 2 and the line 31 is connected a trigger pulse source 33 through a resistor RC1. The emitter regions 4 of the elements Q2, Q5, Q8, . . . (these elements being identified as an element group A) are connected to a line 34*a* in common thereto through resistors RC2, RC5, RC8, . . . respectively, those 4 of the elements Q3, Q6, Q9, . . . (identified as an element group B) are similarly connected to a line 34*b* in common thereto through resistors RC3, RC6, RC9, . . . respectively and those 4 of the elements Q4, Q7, Q10, . . . (identified as an element group C) are likewise connected to a line 34*c* in common thereto through resistors RC4, RC7, RC10, . . . respectively. The lines 34*a*, 34*b* and 34*c* are connected respectively to terminals 37*a*, 37*b* and 37*c* of a three-phase pulse generator 36 having a common terminal 35 connected to the line 31. In this case, the resistance values of the resistors RC1, RC2, . . . are so selected as to obtain the load line 14 or 15 above described in connection with FIG. 4. The pulse generator 36 is adapted to derive from its terminals 37*a*, 37*b* and 37*c* pulses PA, PB and PC which have pulse widths $T_1$ greater than the sum (T on + T off) of the times T on and T off for turning on and off each element and are sequentially displaced apart in phase by a time $T_2$ shorter than the time ($T_1$ − T on) and have a voltage higher than the turnover voltage $V_{p1}$. Further, the trigger pulse source 33 is designed to provide a trigger pulse PT such as depicted in FIG. 9A which has a pulse width $T_2$ and a voltage higher than the turnover voltage $V_{p0}$.

With such an arrangement as shown in FIG. 8, when one trigger pulse PT from the trigger pulse source 33 is obtained from a time $t_0$ simultaneously with or prior to the pulse PA from the terminal 37*a* of the pulse generator 36 while overlapping the pulse PA by a time longer than the time T on, the element Q1 is turned on at the time $t_0$ and the element Q2 is turned on simultaneously with the element Q1 or at the time of obtaining the pulse PA and then the element Q3 is turned on and the element Q1 is turned off at the time $t_1$ of obtaining the pulse PB. At a time $t_1'$ a little past the time $t_1$ the element Q2 is turned off and at a time $t_2$ of obtaining the pulse PC the element Q4 is turned on and at a time $t_2'$ a little past the time $t_2$ the element Q3 is turned off and at a time $t_3$ of obtaining the pulse PA the element Q5 is turned on and at a time $t_3'$ a little past the time $t_3$ the element Q4 is turned off. Thereafter, the same operations are achieved and, in short, if the element Q1 is first turned on by the trigger pulse PT, the elements Q2, Q3, Q4, . . . are sequentially turned on.

The levels at which the trigger pulse PT and the pulses PA, PB and PC are in the off state in the example of FIG. 8 need not always be zero volt but may be a voltage level lower than the turnover voltage $V_{p1}$. Further, the resistors RC1, RC2, . . . , the connecting wires and so on may be formed on the wafer 1 in a monolithic manner.

The shift register of FIG. 8 may be modified such that the resistors RC1, RC4, RC7, . . . , RC2, RC5, RC8, . . . and RC3, RC6, RC9, . . . are connected at one end to the lines 34*a*, 34*b* and 34*c* respectively and the trigger pulse source 33 is connected directly to the emitter region 4 of the element Q1. It will be seen that, also with such an arrangement, the elements Q1, Q2, . . . are sequentially turned on as is the case with the example of FIG. 8.

Figure 10:
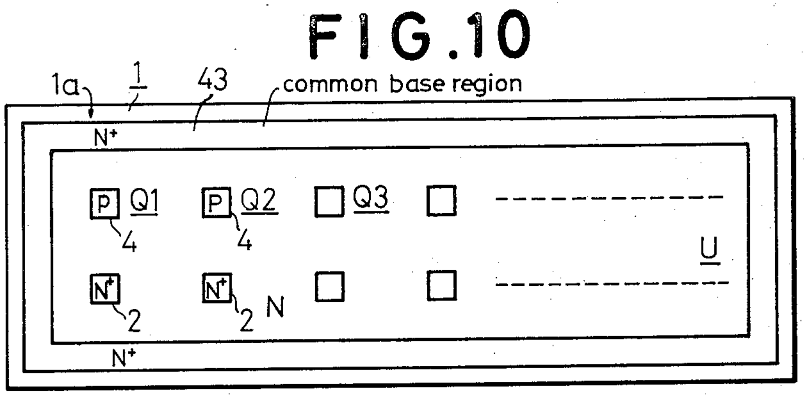
FIGS. 10 to 16, inclusive, are plan views illustrating other examples of the semiconductor device of this invention.

FIG. 10 shows another modified form of the semiconductor device depicted in FIGS. 1 and 2. Accordingly, in the present example parts corresponding to those in FIGS. 1 and 2 are identified by the same reference numerals and characters. The present example is identical in construction with that of FIGS. 1 and 2 except in that the base regions 3 of the elements Q1, Q2, . . . are replaced with one base region 43 which is formed to surround the collector and emitter regions 2 and 4.

In the example of FIG. 10 each of the elements Q1, Q2, . . . consists of the collector and emitter regions 2 and 4 and the common base region 43 as is the case with the example of FIG. 7. Accordingly, the semiconductor device illustrated in FIG. 10 provides the same operational effects as those obtainable with the examples of FIGS. 1 and 2 and 7. In addition, even if the elements Q1, Q2, . . . (hereinafter referred to as an element group U) surrounded by the common base region 43 and similar other element group or groups are formed on the wafer 1 and even if other circuit elements, for example, resistors, capacitors and so on are formed on the wafer 1, there is no possiblity that the operation of each semiconductor element of the element group U exerts an influence upon the other element group or groups and on the other circuit elements. Accordingly, many element groups U or combination of the element group U with the other circuit elements can be formed with high density on the wafer 1 in a monolithic manner. Of course, a shift register similar to that above described in connection with FIG. 8 can be formed with the semiconductor device of FIG. 10.

Figure 11:
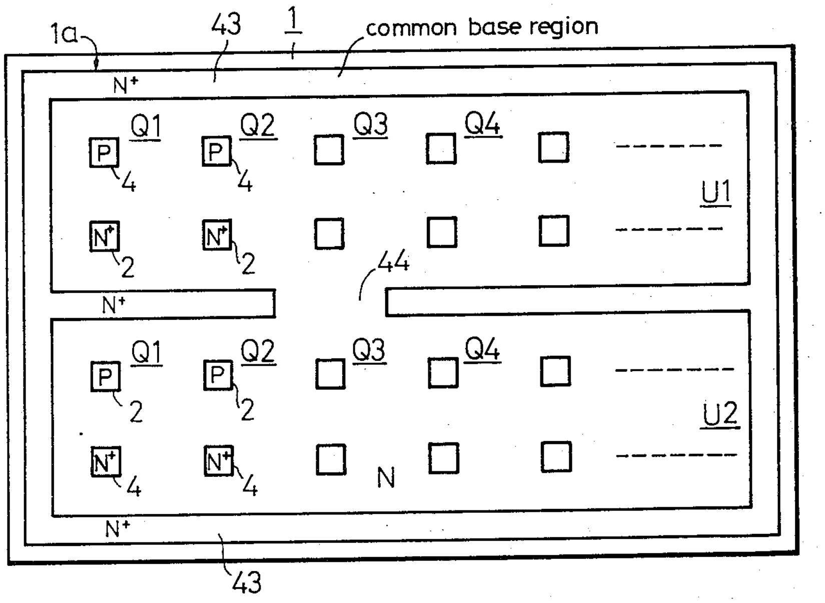

FIG. 11 illustrates another example of this invention based upon the semiconductor device depicted in FIG. 10, in which a plurality of element groups U mentioned above, in the figure two groups (hereinafter referred to as U1 and U2) are formed as an integrated circuit on the wafer 1. In the present example parts corresponding to those in FIG. 10 are marked with the same reference numerals and characters and one part of the common base region 43 of the group U1 on the side of the group U2 and that of the group U2 on the side of the group U1 are formed contiguous to each other but one part of the contiguous common base region 43 is removed to provide an aperture 44.

With the arrangement shown in FIG. 11, the element groups U1 and U2 are surrounded by the common base region 43 respectively, so that the element groups U1 and U2 are not coupled with each other unnecessarily and they can be formed with high density on the wafer 1 common thereto. Since the aperture 44 is formed between the element groups U1 and U2, the groups U1 and U2 are coupled with each other through the elements (in the figure the elements Q3) lying opposite to the aperture 44. Accordingly, a shift register employing the semiconductor device of the present example has various shift register functions as compared with the example of FIG. 8. Namely, in addition to sequential turning-on of the elements Q1, Q2, . . . of the element group U1, the above construction provides a series of operations for sequentially turning on the elements Q1, Q2 and Q3 of the element group U1 and then the elements Q3, Q4, Q5, . . . of the element group U2 and sequentially turning on the elements Q1, Q2 and Q3 of the element group U1 and then the elements Q3, Q2 and Q1 of the element U2.

Figure 12:
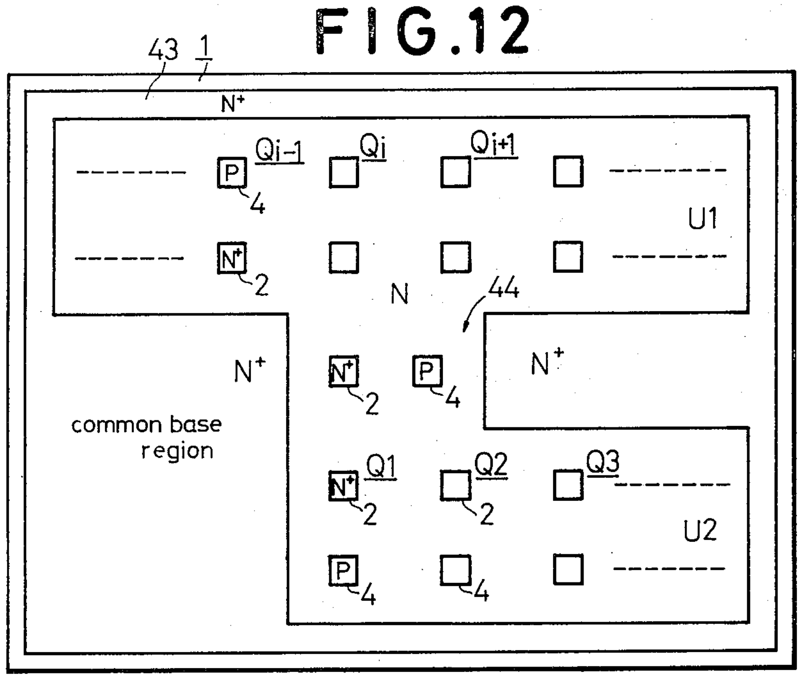

FIG. 12 illustrates a modified form of the above example depicted in FIG. 11. In the present example, the width of the common base region 43 extending between the element group U1 (shown to consist of elements . . . Qi − 1, Qi, Qi + 1, . . . ) and the element group U2 (shown to consist of the elements Q1, Q2, . . . ) is greater than that in the example of FIG. 11. Accordingly, the aperture 44 is greater in depth than that in the example of FIG. 11. In the aperture 44 there is formed an element Q′ including the collector and emitter regions 2 and 4 which can be regarded to belong to the element group U2.

Accordingly, in the case of forming a shift register with the semiconductor device of the example of FIG. 12, it is possible to obtain a series of operations for turning on the element Q′ following the elements . . . Qi − 1, Qi of the element group U1 and then sequentially turning on the elements Q1, Q2, . . . of the element group U2 in addition to sequential turning-on of the elements . . . Qi − 1, Qi, Qi + 1, . . of the element group U1.

Figure 13:
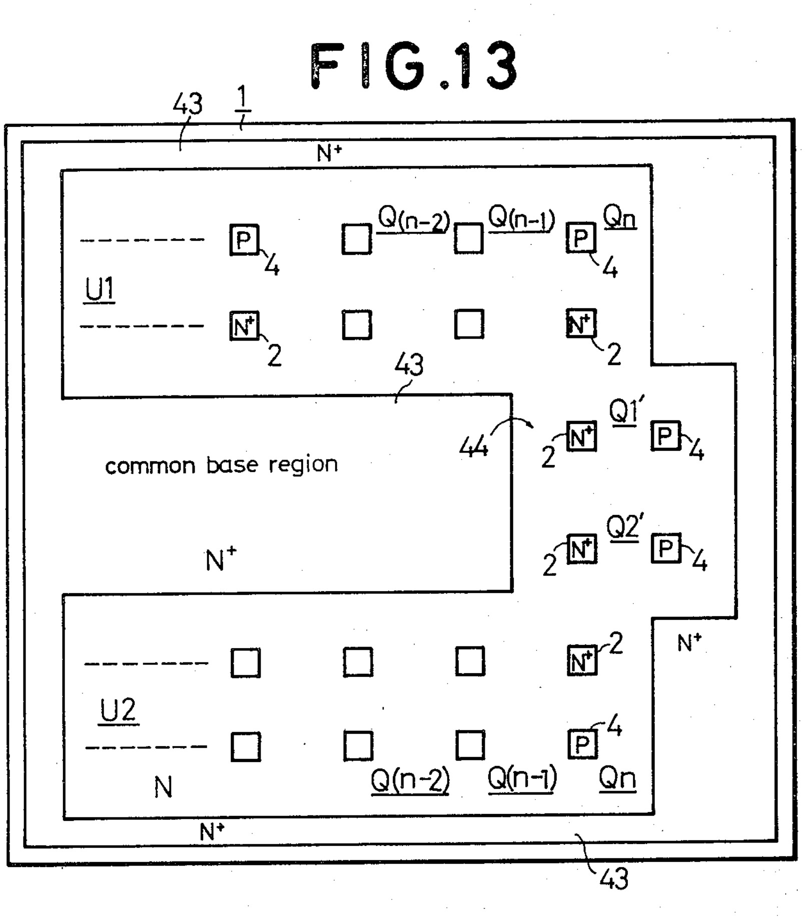

FIG. 13 shows a modified form of the example of FIG. 12. In the present example the aperture 44 is formed in the common base region 43 at a place corresponding to one end portion of each of the element groups U1 and U2 (shown to consist of elements . . . Qn − 1 and Qn respectively) and two elements Q1′ and Q2′ are formed in the aperture 44 in a manner similar to that in the example of FIG. 12.

Accordingly, in the case of forming a shift register with the semiconductor device of the example of FIG. 13, it is possible to obtain a series of operations for sequentially turning on the elements . . . Q*n* − 1 and Q*n* of the element group U1, the elements Q1′ and Q2′ and then the elements Q*n*, Q*n* − 1, . . . of the element group U2.

Figure 14:
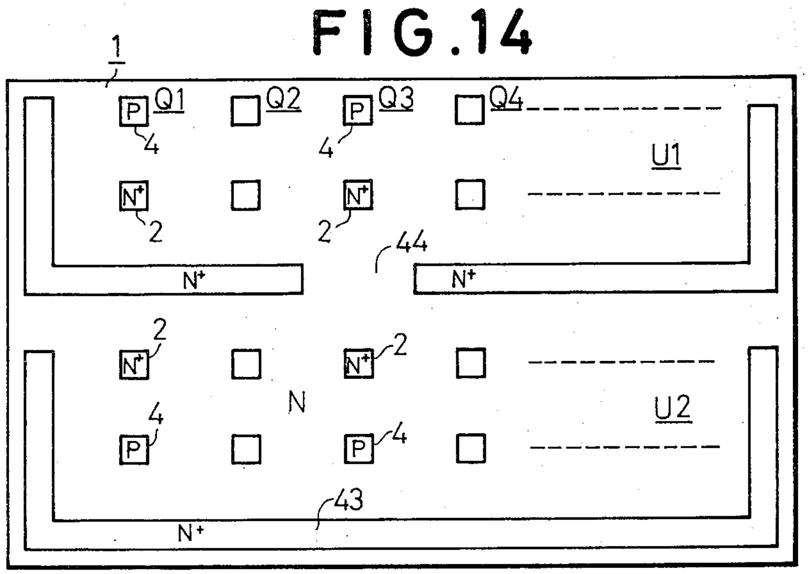

In FIG. 14 there are arranged side by side two element groups (indicated by U1 and U2) above described in connection with FIG. 10 but, in this case, one of the opposing sides of the common base region 43 extending in the direction of the array of the elements Q1, Q2, . . . of each element group is removed. Further, an aperture 44 similar to that in the example of FIG. 11 is formed in one part of the common base region 43 of the element group U1 on the side of the element group U2. The present example provides the same operational effects as those in the example of FIG. 11.

Figure 15:
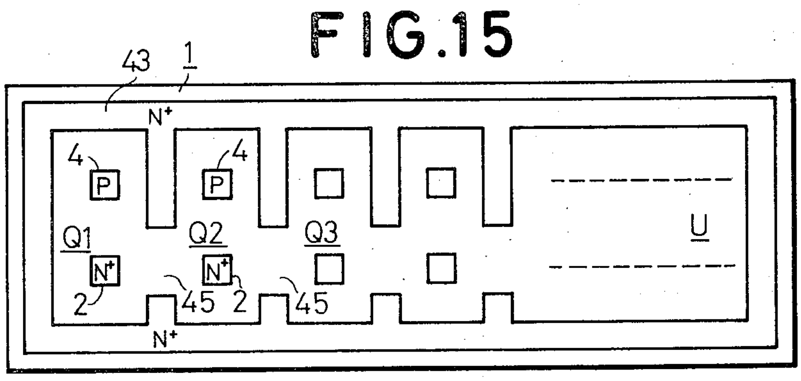

FIG. 15 shows a modified form of the semiconductor device depicted in FIG. 10. In the present example the common base region 43 extends between adjacent ones of the elements Q1, Q2, . . . to separate them from adjacent ones. The common base region 43 extending between adjacent elements is partly removed to form apertures 45, through which adjacent elements are coupled with each other.

The present example provides adjusted coupling between adjacent elements in addition to the effects above described in connection with FIG. 10.

Figure 16:
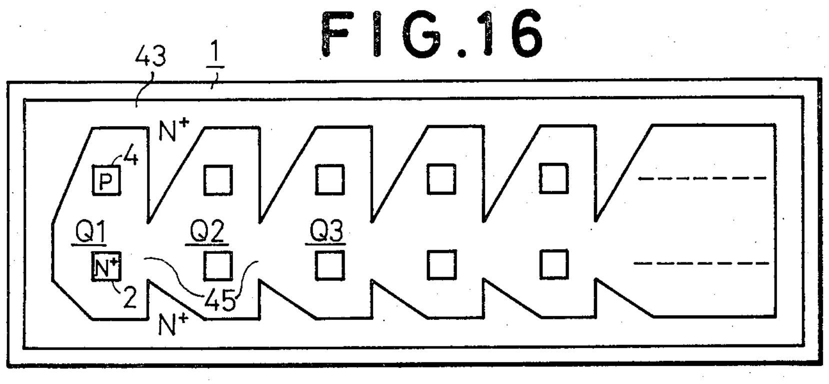

FIG. 16 illustrates a modification of the semiconductor device depicted in FIG. 15, which is identical in construction with the latter except in that the extending portions of the common base region 43 between adjacent elements are not symmetrical with respect to the lines perpendicular to the direction of the array of the elements Q1, Q2, . . . and passing through the center between adjacent elements.

Such a construction as shown in FIG. 16 provides the following advantages in addition to those obtainable with the example of FIG. 15. Namely, the following effects are obtainable with such connections of the semiconductor device as depicted in FIG. 17.

Figure 17:
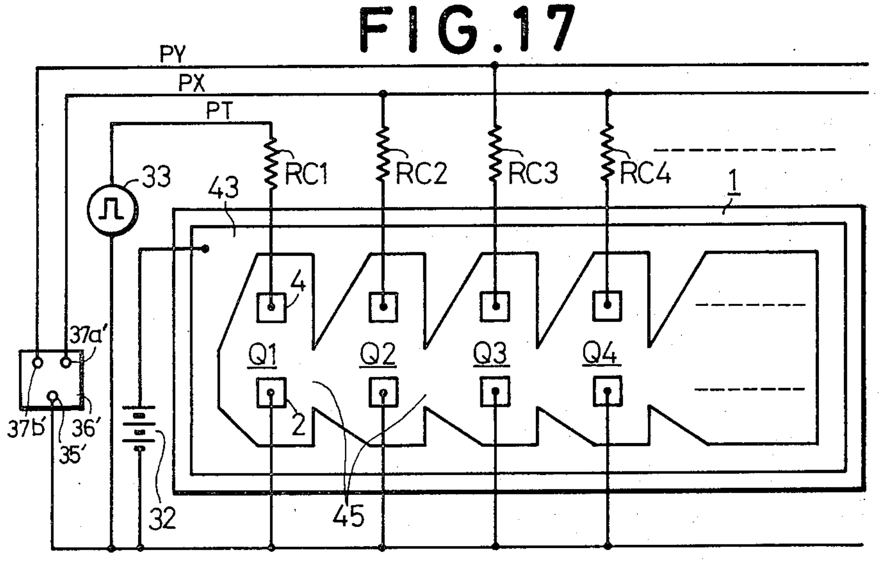
FIGS. 17 and 18 are a circuit diagram and a graph similar to those in FIGS. 8 and 5 respectively.

As shown in FIG. 17, the emitter regions 4 of the elements Q2, Q4, . . . are respectively connected through resistors RC2, RC4, . . . to an output terminal 37*a'* of a two-phase pulse generator 36' from which a first-phase pulse PX is derived and the emitter regions 4 of the elements Q3, Q5, . . . are respectively connected through resistors RC3, RC5, . . . to an output terminal 37*b'* of the pulse generator 36' from which a second-phase pulse PY is derived and the other connections are the same as those in the case of FIG. 8. In this case, however, the base region connected to one end of a power source 32 is designated by 43.

Figure 18:
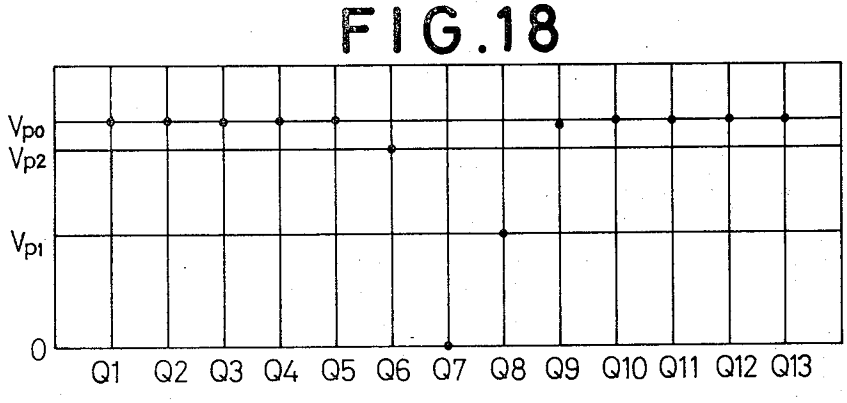

With such an arrangement as shown in FIG. 17, the elements Q1 and Q2 are turned on first by a trigger pulse PT from a trigger pulse source 33 and the pulse PX from the pulse generator 36' and then the element Q3 is turned on and thereafter the elements Q3, Q4, . . . are sequentially turned on. Thus, the same results as those in the case of FIG. 8 are obtained with the two-phase pulse. This is because of the fact that since the portion of the common base region extending between adjacent elements is not symmetric, when the turnover voltage of the element on the right of the element remaining in the on state is $V_{p1}$, that of the left-hand one becomes, for example, about $V_{p2}$ higher than $V_{p1}$. Such a relation is shown in FIG. 18 similar to FIG. 5. Accordingly, the use of the semiconductor device of the present example provides a shift register function which is achieved by the two-phase pulse in one direction (in the figure, to the right).

Figure 19:
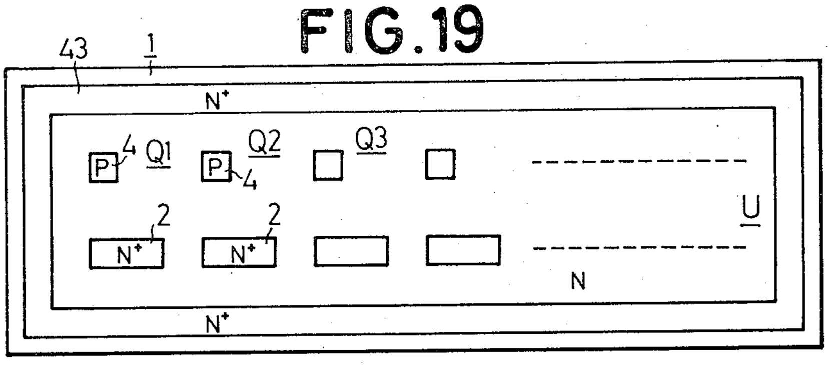
FIGS. 19 to 26, inclusive, are plan views illustrating further examples of the semiconductor device of this invention.

FIG. 19 illustrates a modification of the semiconductor device shown in FIG. 10, in which the centers of the collector regions 2 of the elements Q1, Q2, . . . are shifted in the direction of the array of the elements Q1, Q2, . . . , in the figure, located further to the right than in the foregoing. Accordingly, the collector regions 2 are assymetrical with respect to the lines passing through the centers of the emitter regions 4 and perpendicular to the direction of the array of the elements Q1, Q2, . . . .

With such an arrangement as depicted in FIG. 19, the effects above described in connection with FIG. 10 can be obtained. Further, by connecting the semiconductor device as depicted in FIG. 17 as is the case with the example of FIG. 16, it is possible to obtain the shift register function which is achieved by the two-phase shift pulse in one direction (in the figure, to the right) as previously described in connection with FIG. 17.

Figure 20:
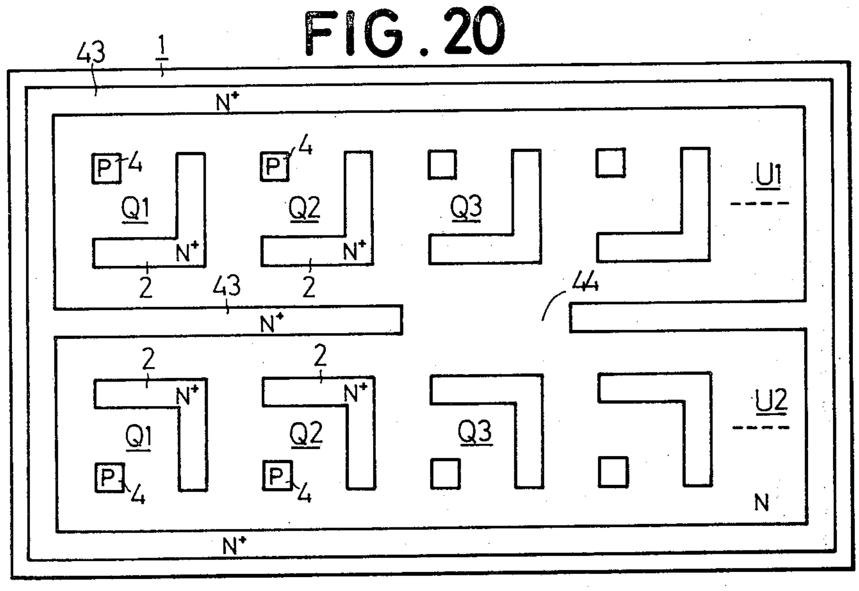

FIG. 20 shows a modified form of the semiconductor device exemplified in FIG. 11, in which the collector regions 2 of the elements Q1, Q2, . . . of the element groups U1 and U2 are formed asymmetrical with respect to the lines passing through the centers of the emitter regions 4 and perpendicular to the direction of the array of the elements Q1, Q2, . . . as is the case with the example of FIG. 19. In this case, however, each collector region 2 is L-shaped in its entirety to extend between adjacent elements.

The construction such as shown in FIG. 20 provides the effects previously described in connection with FIG. 11 and the shift register function which is achieved by the two-phase pulse of FIG. 19 in one direction (in the figure, to the right).

Figure 21:
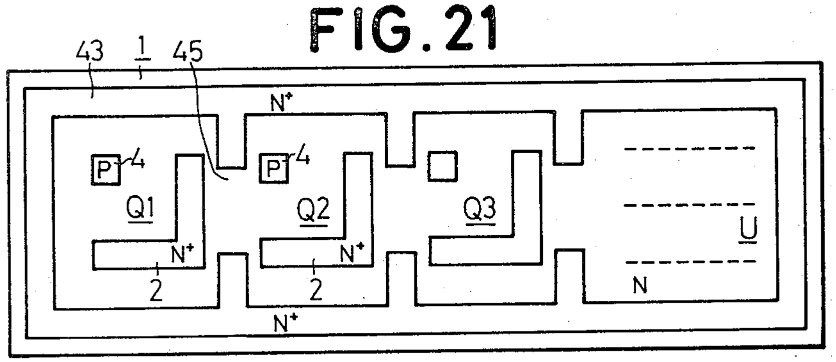

FIG. 21 illustrates a modified form of the semiconductor device depicted in FIG. 15, in which the collector regions 2 of the elements Q1, Q2, . . . have the same configuration as that in the example of FIG. 20. With such an arrangement, it is possible to obtain both the effects previously described in connection with FIG. 15 and those above described with FIG. 19.

Figure 22:
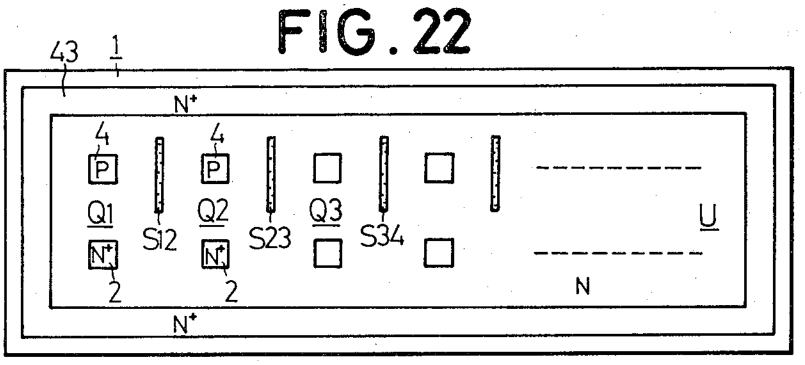

In FIG. 22 there is depicted a modification of the semiconductor device of FIG. 10, in which regions S12, S23, . . . for shortening the lifetime of the carriers in the wafer 1 between adjacent ones of the elements Q1, Q2, . . . are formed, for example, by diffusing an impurity, for example, gold into the wafer 1 between the elements Q1, Q2, . . . .

With such an arrangement as shown in FIG. 22, in the case of the semiconductor device having such connections as depicted in FIG. 8, when the element, for example, Q2 is turned on and then the element Q3 is turned on and then the element Q2 is turned off as previously described in connection with FIG. 8, that is, when the operation is shifted, the lifetime of the carriers present between the collector region 2 of the element Q2 and the emitter region 4 of the element Q3 is shortened by the region S23 rapidly to extinguish the coupling between the elements Q2 and Q3. This provides for greatly enhanced shift speed. Consequently, the use of the semiconductor device constructed as shown in FIG. 22 provides a high-speed shift register function. These regions S12, S23, S34, . . . can also be formed by roughening the surface of the wafer 1 at predetermined areas instead of diffusing gold into the wafer 1.

Figure 23:
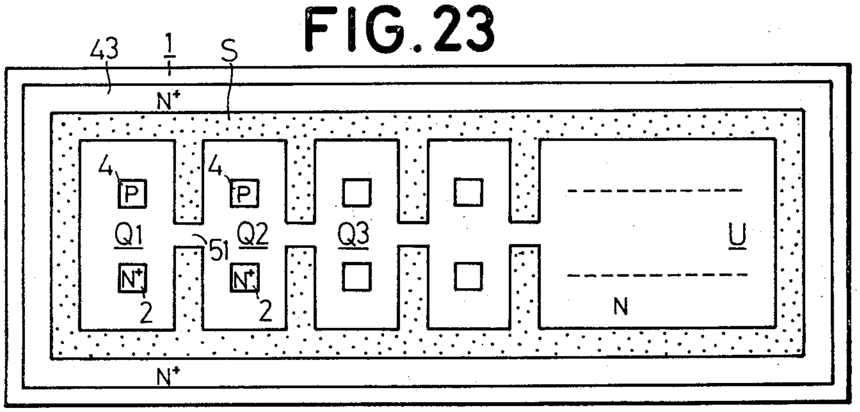

In FIG. 23 there is illustrated a modified form of the semiconductor device of FIG. 22, in which a region *s* similar to those S12, S23, . . . above described in connection with FIG. 22 is formed to extend around the regions 2 and 4 of each of the elements Q1, Q2, . . . but in which the portions extending between adjacent elements are partly removed to form apertures 51 through which adjacent elements are coupled with each other.

With such an arrangement, the region S for shortening the lifetime of the carriers is formed between adjacent elements as is the case with the example of FIG. 22 and surrounds the regions 2 and 4 of each element, so that such connections of the semiconductor device as shown in FIG. 8 provides the shift register function having higher shift speed than in the example of FIG. 22. Further, the impedance between the base and emitter regions 3 and 4 of each element becomes high to facilitate the use of the semiconductor device.

Figure 24:
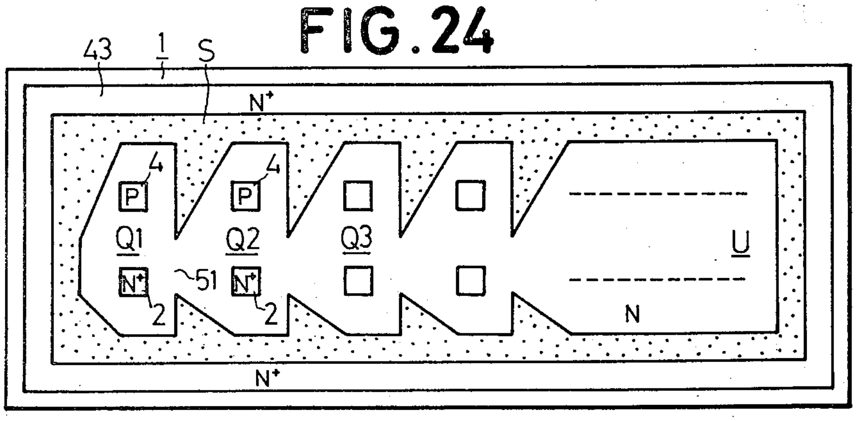

FIG. 24 illustrates a modified form of the semiconductor device of FIG. 23, which is identical in construction with the latter except in that the region S surrounding the regions 2 and 4 of each element is partly asymmetrical with respect to the line perpendicular to the direction of the array of the elements Q1, Q2, . . . and passing through the center between adjacent elements.

With such an arrangement as depicted in FIG. 24, it is possible to obtain the advantage obtainable with the construction of FIG. 23 and a shift register function similar to those obtainable with the examples of FIGS. 16, 19, 20 and 21.

Figure 25:
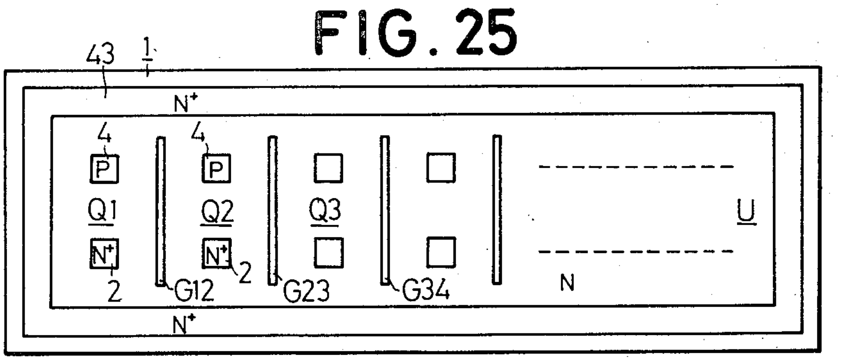

FIG. 25 shows another example of this invention, which is identical in construction with the example of FIG. 10 except in that N-type regions G12, G23, . . . of relatively high impurity concentration are formed between adjacent ones of the elements Q1, Q2, . . . .

With such an arrangement as shown in FIG. 25, even when the element, for example, Q2 is in the on state, if the potential of the region G23 is selected, for example, substantially equal to that of the region 43, the turnover voltage of the element Q3 adjacent the element Q2 across the region G23 does not substantially vary but if the potential of the region G23 is selected equal to those of the collector regions of the elements Q2 and Q3, the turnover voltage of the element Q3 becomes lower. Accordingly, the construction of FIG. 25 enables gate control of shifting of sequential turning-on of the elements Q1, Q2, . . . with the regions G12, G23, . . . . Therefore, the use of the semiconductor device of FIG. 25 provides the function of a logic circuit.

Also in the example of FIG. 25, the conductivity type of the regions G12, G23, . . . can be altered to the P-type one and, in some cases, the regions G12, G23, . . . can be replaced with metal electrodes formed on the substrate.

Figure 26:
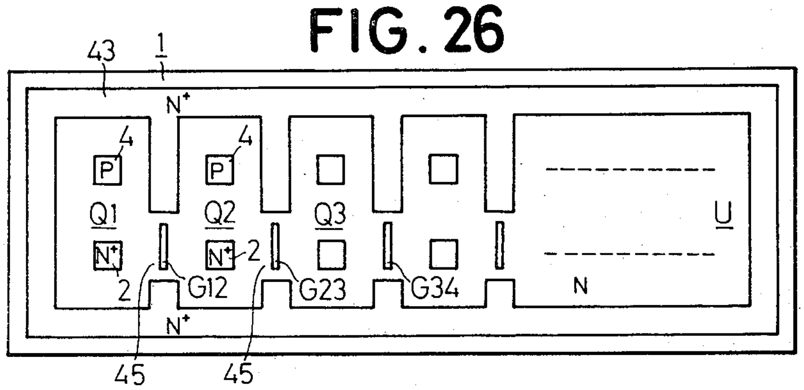

In FIG. 26 there is shown another modification of the semiconductor device of FIG. 15, in which the regions G12, G23, . . . are formed at the positions of the apertures 45 between adjacent ones of the elements Q1, Q2, . . . respectively. Such a construction as depicted in FIG. 26 provides the advantages above described in connection with FIGS. 15 and 25.

Figure 27:
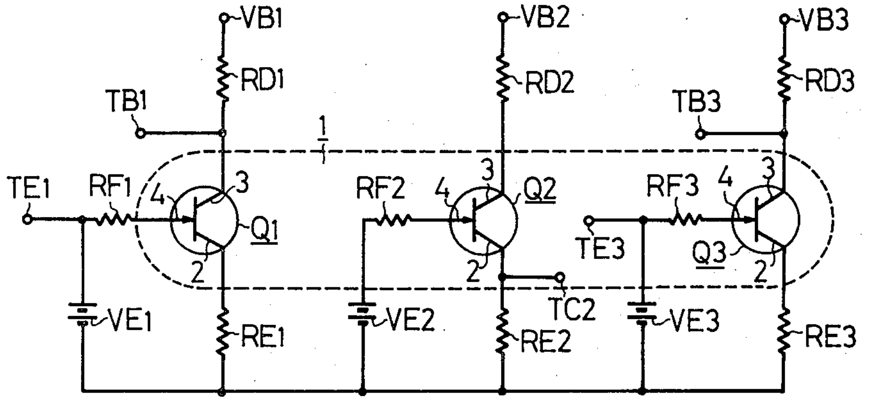
FIG. 27 shows one example of a circuit capable of providing a logic function by the employment of the semiconductor device of this invention.

FIG. 27 illustrates one example of an integrated logic circuit or device formed with the semiconductor device of the present invention previously described in connection with FIG. 1. The present example employs the three elements Q1, Q2 and Q3 of the semiconductor device. The base regions 3 of the elements Q1, Q2 and Q3 are connected to power source terminals VB1, VB2 and VB3 through resistors RD1, RD2 and RD3 respectively, their collector regions 2 are grounded through resistors RE1, RE2 and RE3 respectively and their emitter regions 4 are connected through resistors RF1, RF2 and RF3 respectively to voltage sources VE1, VE2 and VE3 which are grounded at one end. The resistance values of resistors RF1 and RE1 are so selected as to provide a load line such as indicated by 14 in FIG. 4. In this case, these resistors are formed monolithic in the semiconductor wafer 1 in a known manner and wires for making up the circuit of FIG. 27 may also be formed on the wafer 1.

With such an arrangement as shown in FIG. 27, logic input terminals TE1 and TE3 are connected to the connection points of the resistor RF1 with the voltage source VE1 and the resistor RF3 with the voltage source VE3 respectively and if the constants of the elements Q1 and Q3 and those associated therewith are selected equal to one another so that when the input terminals TE1 and TE3 are supplied with logic inputs signified by a positive voltage the elements Q1 and Q3 may be turned on, the turnover voltage $V_{p1}$ (hereinafter referred to as $V_{p11}$) of the element Q2 while either one of the elements Q1 and Q3 is in the on state and the turnover voltage $V_{p1}$ (hereinafter referred to as $V_{p12}$) of the element Q2 while both of the elements Q1 and Q3 are in the on state bear such a relationship as $V_{p12} < V_{p11}$. Accordingly, if the value $v_{e2}$ of the voltage source VE2 of the element Q2 is selected to bear a relationship $V_{p12} < v_{e2} < V_{p11}$, when the logic inputs "1" are applied to the input terminals TE1 and TE2 respectively, the elements Q1 and Q3 are turned on simultaneously to derive a logic output "1" from a terminal TC2 connected to the collector region 2 of the element Q2, thus providing an AND function. Further, in this case, by suitably selecting the values of the voltage sources VE1 and VE3, the resistor RF2 and so on, the level of the logic output "1," that is, an AND output from the terminal TC2 can be made equal to those of the logic inputs "1" applied to the terminals TE1 and TE3.

Further, in the case where the values of the respective constants in the case of obtaining the aforesaid AND output are changed or held unchanged and the distances between the elements Q1 and Q2 and between the elements Q2 and Q3 are made relatively small and a relation $V_{p11} < v_{e3} < V_{p0}$ is established among the turnover voltages $V_{p0}$ and $V_{p11}$ of the element Q2 in the cases of neither and either of the elements Q1 and Q3 being in the on state and the voltage $v_{e3}$ of the voltage source VE3, the element Q2 is turned on by the logic input "1" applied from the terminal TE1 or TE3 to derive a logic output "1" from the terminal TC2, so that an OR function can be obtained.

Figure 28:
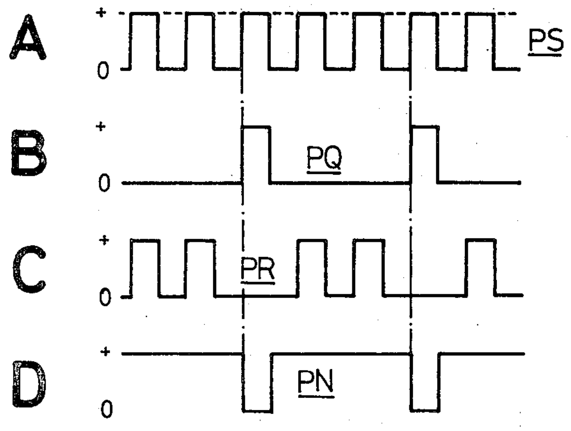
FIG. 28 shows signal waveforms for use with the circuit of FIG. 27.

Under the condition that the respective constants for obtaining the AND output are held unchanged, a synchronizing pulse PS such as shown in FIG. 28A which has an "on" level at the level of the aforementioned logic input "1" and an "off" level at a level of zero voltage is applied to the terminals TE1 and TE3 to turn on the elements Q1 and Q3 while the synchronizing pulse PS is in the on state, thereby lowering the turnover voltage of the element Q2 to turn it on. Further, terminals TB1 and TB3 are connected to the base regions 3 of the elements Q1 and Q3 and are supplied with a logic input PQ representative of "1" such as depicted in FIG. 28B which is synchronized with the synchronizing pulse PS, by which the turnover voltages of the elements Q1 and Q3 become high while the logic input PQ is "1," during which the elements Q1 and Q3 are in the off state. As a result of this, a pulse such as shown in FIG. 28C, which is synchronized with the synchronizing pulse PS while the logic input PQ is not "1," is derived as a logic output PR at the terminal TC2. Thus, a NAND function can be obtained.

Further, under the condition that the respective constants for obtaining the aforesaid OR output are held unchanged, the aforementioned synchronizing pulse PS shown in FIG. 28A is applied to the terminal TE1 or TE3 and the logic input PQ depicted in FIG. 28B is applied to the terminal TB1 or TB3, by which a logic output PN shown in FIG. 28C is derived at the terminal TC2, thus obtaining a NOR function.

Moreover, under the condition that the respective constants for obtaining the aforesaid AND (or OR) output are maintained, a voltage such as indicated by a broken line in FIG. 28A which is the "on" level of the synchronizing pulse PS is applied to the terminals TE1 and TE3 or the voltages of the voltage sources VE1 and VE3 are selected in advance to be equivalent to the above voltage and logic input PQ depicted in FIG. 28B is supplied to the terminals TB1 and TB2 (or the terminal TE1 or TE3), by which is derived at the terminal TC2 a logic output such as shown in FIG. 28D which is in the off state while the logic input is in the on state, as will be apparent from the manner of obtaining the NAND output PR (or NOR output PN) described above.

Although the example of FIG. 27 has been described in connection with the case where the emitter regions 4 of the elements Q1, Q2 and Q3 are connected through the resistors to the voltage sources grounded at one end, it is also possible to obtain exactly the same results as the aforementioned ones by connecting two resistors in series between the power source terminal connected through the resistor to the base region of each element and ground and by connecting the connection point of the resistors to the emitter region of each element through a resistor and by applying a bias voltage between the emitter and collector regions of each element.

Figure 29:
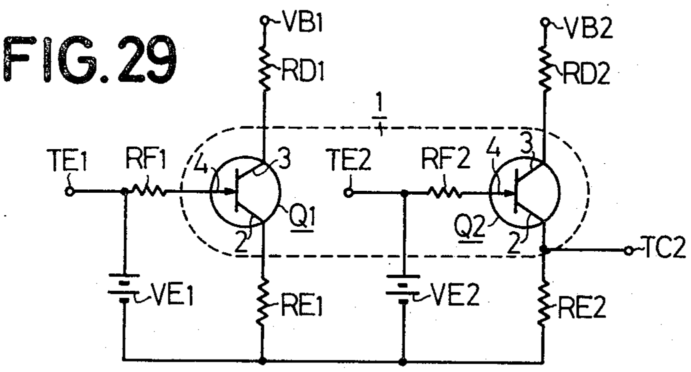
FIG. 29 shows another example of the circuit capable of providing the logic function.

Further, while the example of FIG. 27 has been described in connection with the logic device formed to include the three elements Q1, Q2 and Q3, the logic device can be constructed with only the elements, for example, Q1 and Q2 without using the element Q3. In this case, the logic device is formed identical in construction with the example of FIG. 23 except in that the element Q3 and the circuits associated therewith are removed, as depicted in FIG. 29. In this case, however, it is possible to obtain an AND function in the following manner. Namely, a terminal TE2 is connected to the emitter region 4 of the element Q2, the element Q1 is adapted to be turned on when the logic input "1" is applied to the terminal TE1 and the turnover voltage $V_{p1}$ while the element Q1 is in the on state, the voltage $v_{e2}$ of the voltage source VE2, the level voltage $v$ of the logic input "1" to the terminal TE2 and the turnover voltage $V_{p0}$ of the element Q2 while the element Q1 is in the off state are selected to bear a relation that $V_{p1} < v_{e2} + v < V_{p0}$. In such a case, only when the logic inputs "1" are simultaneously fed from the terminals TE1 and TE2, the element Q2 is turned on to derive from the terminal TC2 a logic output "1," that is, an AND output. Thus, the AND function can be obtained.

Figure 30:
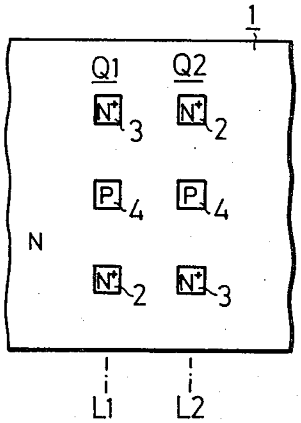
FIGS. 30 to 33, inclusive, are plan views illustrating other examples of the semiconductor device capable of providing the logic function.
Figure 31:
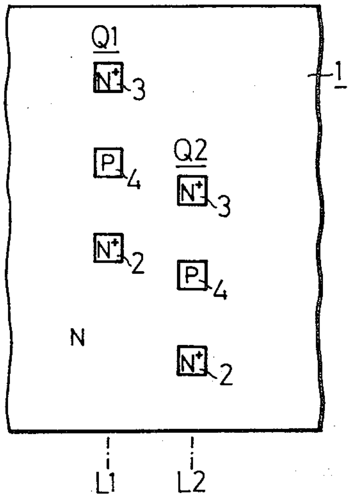

Moreover, in the case where the logic device is made up of the two elements Q1 and Q2 as above described in connection with FIG. 29, it is possible to obtain a NOT output from the terminal TC2 in the following manner. Namely, the base, emitter and collector regions 3, 4 and 2 of the elements Q1 and Q2 are sequentially formed on the wafer 1 on lines L1 and L2 respectively as shown in FIG. 30 or the base, emitter and collector regions 3, 4 and 2 of the elements Q1 and Q2 are formed on the lines L1 and L2 respectively but the positions of the regions of the elements Q1 and Q2 are staggered in the extending direction of the lines L1 and L2 as illustrated in FIG. 31, by which electrons and/or holes produced during the on state of the element Q1 are caused to reach the vicinity of the area between the base and emitter regions 3 and 4 of the element Q2, thereby increasing the turnover voltage of the element Q2 while the element Q1 is in the on state. Further, the elements Q1 and Q2 are connected in the same manner as that described in connection with FIG. 29 and the element Q2 is adapted to be turned on during the on state of the pulse PS indicated by the solid line in FIG. 28A when the pulse PS is applied to the terminal TE2 but the element Q1 is adapted to be turned on by supplying the terminal TE1 with the logic input PQ depicted in FIG. 28B, by which the turnover voltage of the element Q2 is raised and, after all, the element Q2 is turned on based upon the pulse PS of FIG. 28A only in the period during which no logic input PQ is present. Thus, such a NOT output as shown in FIG. 28C can be obtained from the terminal TC2.

Figure 32:
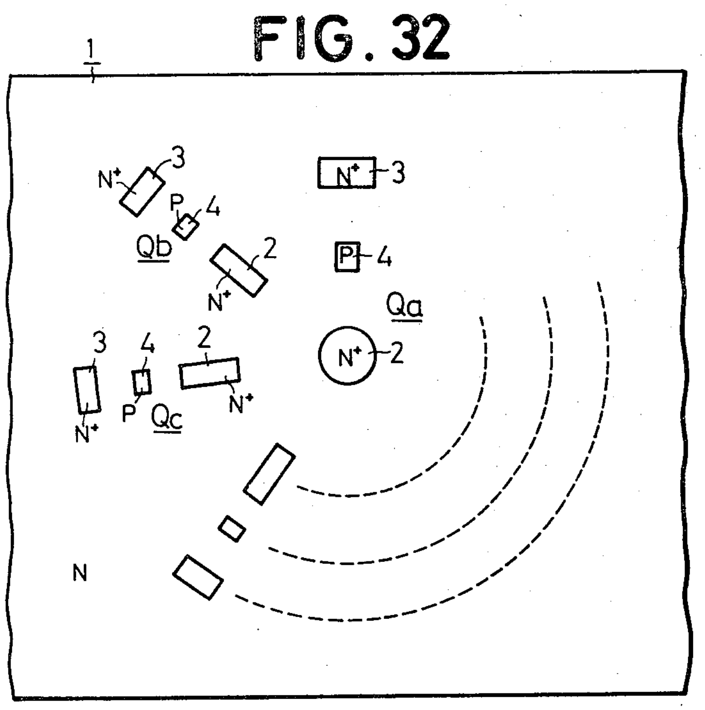

While the foregoing description has been given in connection with the logic devices employing three and two elements respectively, it is also possible to obtain a logic function by the employment of such a construction as shown in FIG. 32. Namely, many elements Qa, Qb, Qc, . . . each consisting of base, emitter and collector regions 3, 4 and 2 are formed in the wafer 1 as depicted and are adapted so that the aforesaid carrier coupling effect between the elements Q1 and Q2 and between Q2 and Q3 in FIG. 27 may be obtained between the element *Qa* and any of the other elements *Qb*, *Qc*, . . . respectively but may not substantially be obtained between adjacent ones of the elements *Qb*, *Qc*, . . . . The elements *Qb*, *Qc*, . . . are used for receiving a logic input and the element Qa is for producing a logic output.

Figure 33:
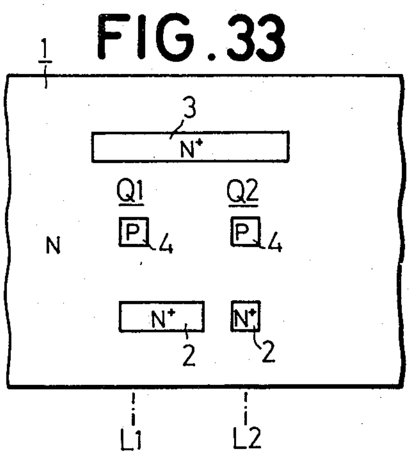

Further, in the case of forming, for example, two elements Q1 and Q2 in the wafer 1, as depicted in FIG. 33, the collector region 2 of the element Q1 is formed to extend toward the element Q2 asymmetrically with respect to the line L1 in a manner to cause a great change in the turnover voltage of the element Q2 due to turning-on of the element Q1 but to cause substantially no change in the turnover voltage of the element Q1 due to turning-on of the element Q2. With such an arrangement, a logic output is derived from the emitter or collector region 4 or 2 of the element Q2 based upon a logic input to the emitter or collector region 4 or 2 of the element Q1 but it is also possible that no similar logic output is derived from the element Q1 with a similar logic input to the element Q2. In the present example the base region 3 is common to the elements Q1 and Q2 but it is also possible to employ separate base regions 3 and derive the logic output from that of the element Q2.

Although the foregoing examples of FIGS. 27 to 33 have been described in connection with the case where each element achieves a monostable operation while being biased as indicated by 14 in FIG. 4 but it is also possible to cause each element to perform a bistable operation while being biased as indicated by 15 in FIG. 4 by suitable selection of the constants and the level and polarity of the logic signal used.

Figure 34:
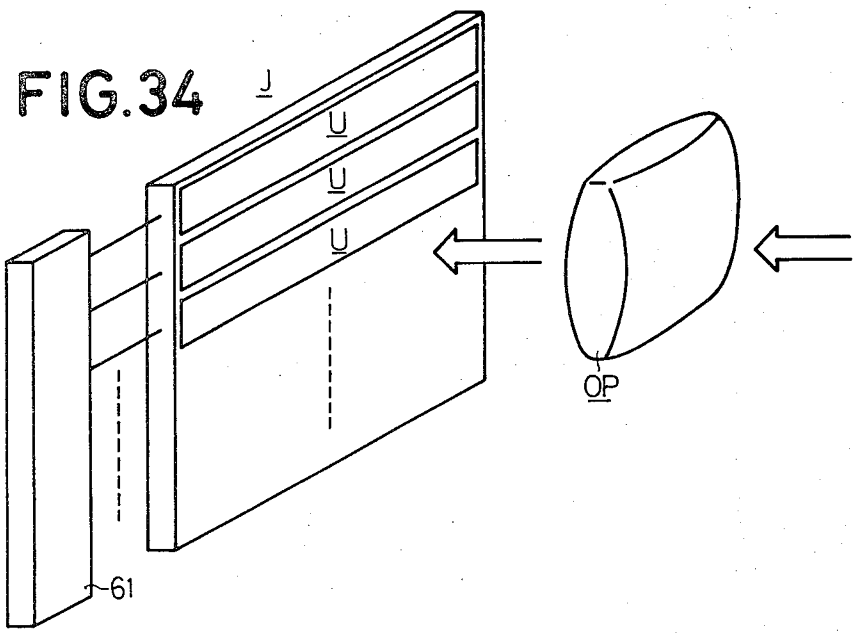
FIG. 34 is a perspective view showing one example of a photoelectric conversion apparatus employing the semiconductor device of this invention.

FIG. 34 illustrates one example of the photoelectric conversion apparatus of this invention which can be formed with the semiconductor devices of the foregoing examples. In the illustrated example, an optical image pattern is projected through an optical system OP onto an apparatus J in which a plurality of semiconductor devices U previously described in connection with FIG. 7 or 10 are arranged side by side. The semiconductor element or elements at a place corresponding to high light of the optical image pattern projected onto the apparatus are excited and turned on to store light and darkness of the optical image pattern in the device U. In this case, storage of light and darkness of the optical image pattern is achieved in the following manner. Namely, by applying a bias voltage V lower than the aforementioned voltage $V_{p0}$ between the collector and base regions 2 and 3 of each semiconductor element of the apparatus J and by preselecting a load for each element to obtain the load line 15 above described in connection with FIG. 4, the element or elements irradiated by light of such an intensity as to provide a relation $V > V_{p0}$ in the element or elements are turned on and the other elements remain in the off state. Thus, light and darkness of the optical image pattern are stored. While, each device U of the apparatus J is connected to a circuit 61 including a power source, a drive circuit, a read-out circuit and so on in such a manner that it may be driven to obtain the shift register function above described in connection with FIG. 8 and its output may be read out. Accordingly, the apparatus J is designed so that a time-sequential electrical image pattern signal or video signal corresponding to light and darkness of the optical image pattern is obtained with the circuit 61. It will be seen that an optical display apparatus can be formed through processes quite reverse in order to the aforementioned ones because electronhole plasma existing during the on state of the element or elements emits light due to recombination radiation.

Figures 35, 36:
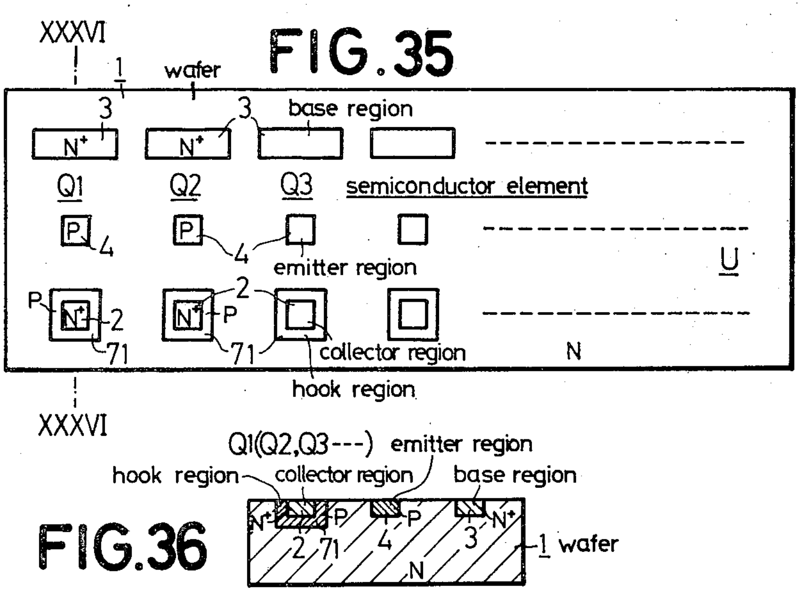
FIG. 35 is a plan view showing another example of the semiconductor device of this invention.
FIG. 36 is a cross-sectional view taken on the line XXXVI—XXXXI in FIG. 35.
Figure 37:
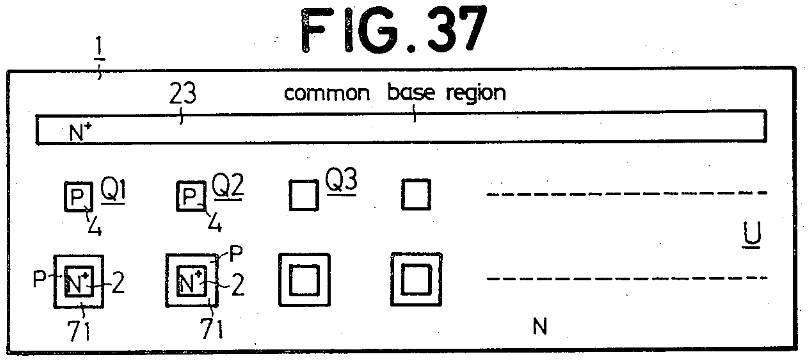
FIGS. 37 to 44, inclusive, are plan views illustrating other examples of the semiconductor device of this invention.
Figure 38:
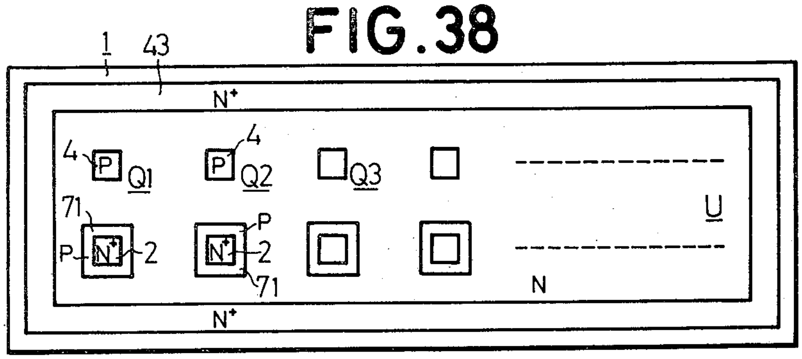
Figure 39:
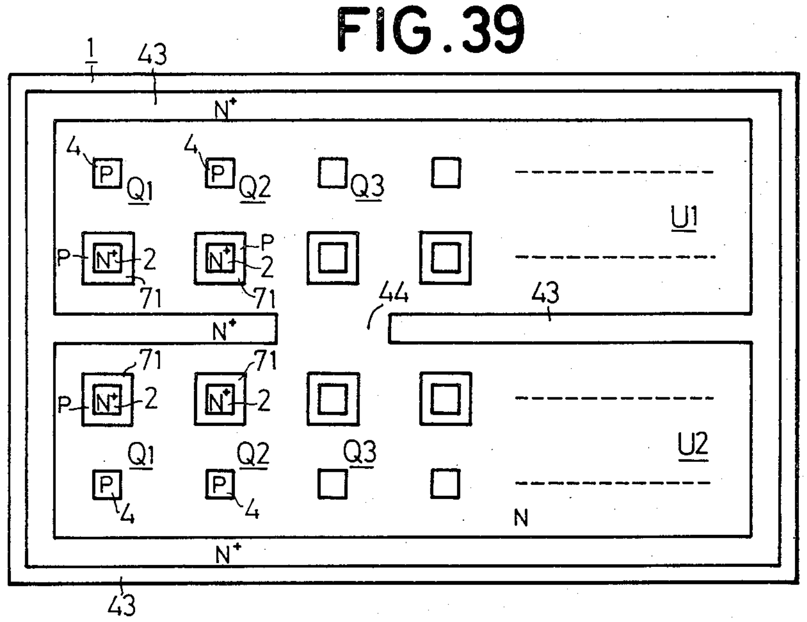
Figure 40:
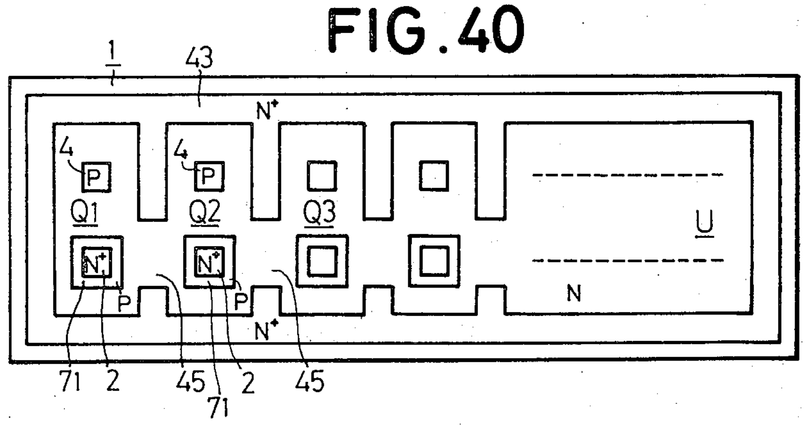
Figure 41:
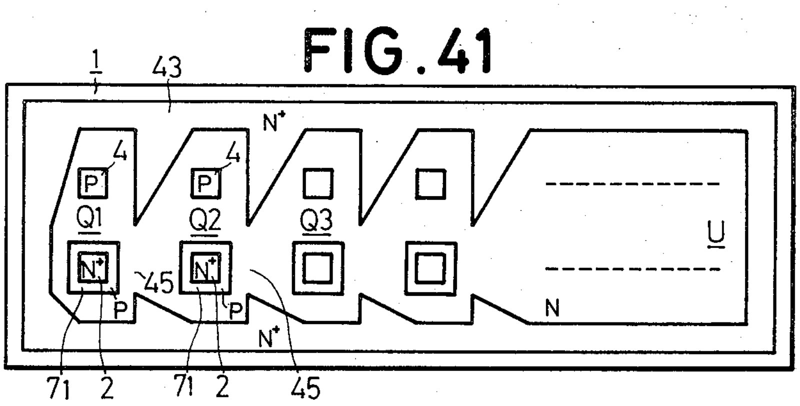
Figure 42:
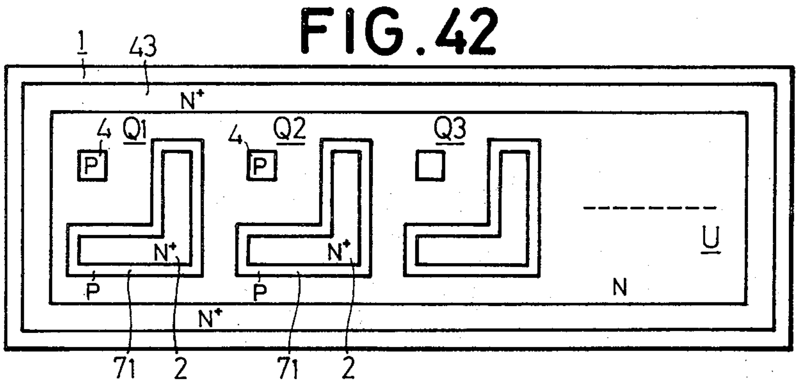
Figure 43:
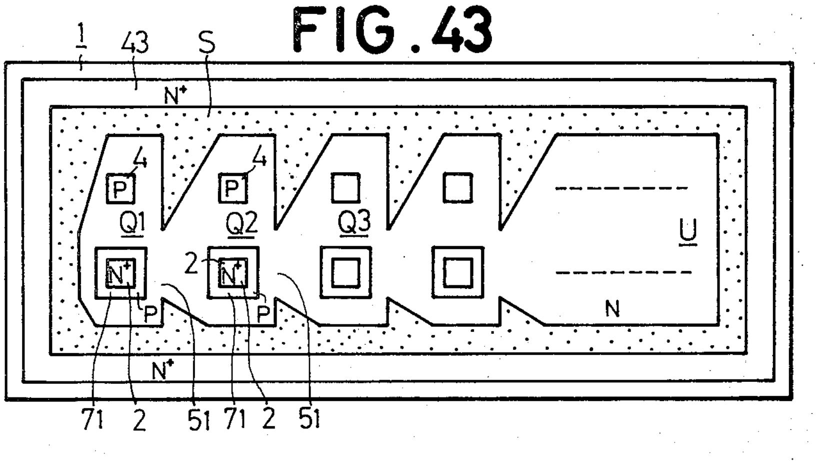
Figure 44:
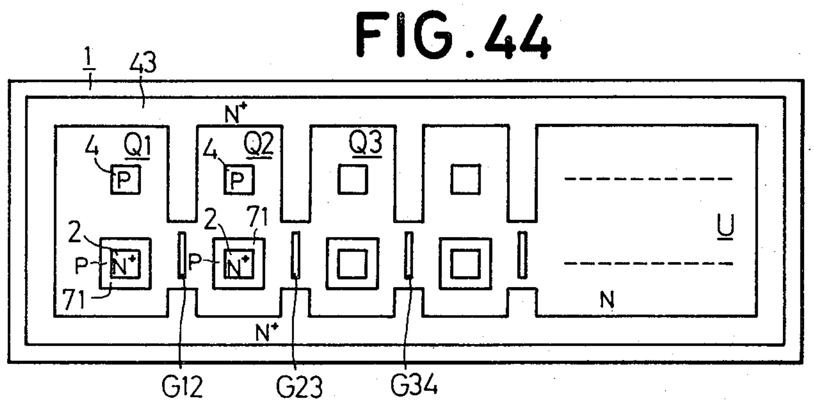

FIGS. 35 and 36 show another improvement of the semiconductor device previously described in connection with FIGS. 1 and 2. In FIGS. 35 and 36, parts corresponding to those in FIGS. 1 and 2 and the present example is identical in construction with that of FIGS. 1 and 2 except in that the collector regions 4 of the semiconductor elements Q1, Q2, . . . are formed in P-type regions 71 formed in the wafer 1 respectively. Consequently, the illustrated example has such a construction that each of the semiconductor elements Q1, Q2, . . . consists of base, emitter and collector regions 3, 4 and 2 formed in the wafer 1 and the region 71. The P-type regions 71 are formed by diffusing, for example, boron into the wafer 1 and have an impurity concentration of, for example, $10^{18}$ atoms/$cm^3$ and are, for example, 15 microns long, 15 microns wide and 3 microns deep.

The mechanisms for the operations of the elements Q1, Q2, . . . are similar to those previously described in connection with the example of FIGS. 1 and 2. Accordingly, no detailed description will be repeated but each element presents a current controlled negative resistance characteristic similar to that described with FIGS. 1, 2, 3 and 4 and the P-type region 71 of each element is commonly referred to as a "hook." However, each element provides a higher peak voltage with respect to the same bias voltage $V_{BC}$ as compared with each of the elements Q1, Q2, . . . described in connection with FIGS. 1 and 2 and the elements of the present example are highly excellent in uniformity of their peak voltages. Further, while each element is in the off state, a current flowing between its base and collector is very small, so that it has an excellent characteristic in that power dissipation during its off state can be reduced.

Figure 5:
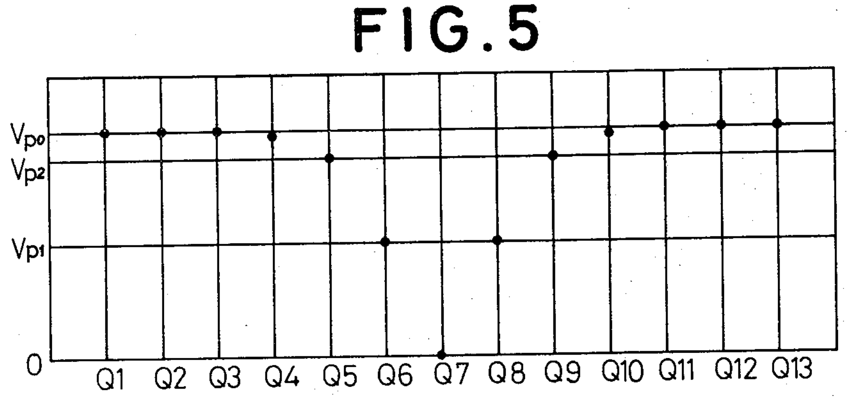
FIG. 5 is a graph showing the turnover voltage of the semiconductor elements when one of the semiconductor element is in the on state.

The semiconductor device shown in FIGS. 35 and 36 provides the same effects as those above described in connection with FIGS. 1 and 2 together with FIGS. 5 and 6. Accordingly, no detailed description will be repeated but the semiconductor device of FIGS. 35 and 36 can be employed for apparatus such as a shift register and the like, as is the case with the example of FIGS. 1 and 2.

FIGS. 37, 38, 39 and 40 illustrate other examples of the semiconductor devices of FIGS. 7, 10, 11 and 15 and these examples are similar in construction to those of FIGS. 7, 10, 11 and 15 except in that the elements Q1, Q2, . . . are formed to include the hook regions 71 respectively as in the example of FIGS. 35 and 36. Accordingly, in FIGS. 37, 38, 39 and 40 parts corresponding to those in FIGS. 7, 10, 11 and 15 are identified by the same reference numerals and characters and no detailed description will be given of these devices. These devices also provide the same effects as those obtainable with the devices of FIGS. 7, 10, 11 and 15.

FIGS. 41 and 42, 43 and 44 show other modified forms of the semiconductor devices previously described in connection with FIGS. 16, 21, 24, and 31. These illustrated examples are identical in construction with those of FIGS. 16, 21, 24, and 31 except in that the elements Q1, Q2, . . . are formed to include the hook regions 71 respectively as in the example of FIGS. 35 and 36. In FIGS. 41, 42, 43 and 44 parts corresponding to those in FIGS. 16, 21, 24 and 31 are marked with the same reference numerals and characters and no detailed description will be given. These devices also provide the same effects as those obtainable with the devices of FIGS. 16, 21, 24 and 31.

Of course, the semiconductor devices of FIGS. 35 to 44 can be used for the shift register, a logic circuit or device similar to that described in connection with FIGS. 27 and 29 and the photoelectric conversion apparatus above described in connection with FIG. 34.

The foregoing examples should be construed as merely illustrative of this invention and not as limiting the invention specifically thereto and various modifications and variations may be effected with desired combinations of the concepts set forth in the examples of FIGS. 1 and 2, 7, 10 to 16, 19 to 26, 30 to 33, 35 and 36 and 37 to 44.

Although the foregoing examples have been described in connection with the case where a single wafer is used as a substrate, it will be seen that the same results can be obtained by using as the substrate, for example, a N-Si layer epitaxially grown on an $N^{+}$-, $P^{+}$-type substrate or a saphire, spinel or like substrate. In the case of an N-type epitaxial layer on an $N^{+}$-type substrate, the aforementioned base region may be replaced by the $N^{+}$-type substrate. It is evident that, in use as a shift register, the set of discrete collector regions can be replaced by an elongated collector region parallel to the base region.

It will be apparent that many modifications and variations may be effected without departing from the scope of the novel concepts of this invention.

We claim as our invention:

1. A semiconductor device comprising a plurality of semiconductor elements formed in a monolithic manner in a semiconductor wafer having a first conductivity type, in which each of the plurality of semiconductor elements consists of at least a collector region formed in the semiconductor wafer and having the first conductivity type and higher conductivity than the semiconductor wafer, a base region formed in the semiconductor wafer and having the first conductivity type and higher conductivity than the semiconductor wafer, and an emitter region formed in the semiconductor wafer and having a second conductivity type, at least the emitter regions of the semiconductor elements being formed separately of each other and each semiconductor element presenting a current controlled negative resistance characteristic between the emitter and collector regions with a biasing power source being applied between the base and collector regions, and in which the distance between any one of the semiconductor elements and at least one of the other semiconductor elements adjacent to the former is selected so that when the former is in the on state with the biasing power source being applied between the base and collector regions of the two semiconductor elements, the turnover voltage of the other semiconductor element may be varied by modulation due to the injection of carriers from the former semiconductor element in the on state to the vicinity of the latter element through the semiconductor wafer.

2. A semiconductor device as claimed in claim 1, wherein the collector and emitter regions of the semiconductor elements are formed separately of each other, respectively.

3. A semiconductor device as claimed in claim 1, wherein the collector, emitter and base regions of the semiconductor elements are formed separately of each other, respectively.

4. A semiconductor device as claimed in claim 1, wherein the base region of each of the plurality of semiconductor elements is common to all of the semiconductor elements and extends along an array of the semiconductor elements.

5. A semiconductor device as claimed in claim 1, wherein the base region of each of the plurality of semiconductor elements is common to all of the semiconductor elements and surrounds the semiconductor elements.

6. A semiconductor device comprising at least first and second semiconductor element groups each consisting of a plurality of semiconductor elements formed in a monolithic manner in a semiconductor wafer having a first conductivity type, in which each of the plurality of semiconductor elements of the first and second groups consists of at least a collector region formed in the semiconductor wafer and having the first conductivity type and higher conductivity than the semiconductor wafer, a base region formed in the semiconductor wafer and having the first conductivity type and higher conductivity than the semiconductor wafer, and an emitter region formed in the semiconductor wafer and having a second conductivity type, at least the emitter region of the semiconductor elements being formed separately of each other and each semiconductor element presenting a current controlled negative resistance characteristic between the emitter and collector regions with a biasing power source being applied between the base and collector regions, in which the distance between two adjacent ones of the semiconductor elements is selected so that when one of the two adjacent semiconductor elements is in the on state with the biasing power source being applied between the base and collector regions of the two adjacent semiconductor elements, the turnover voltage of the other semiconductor may be varied by modulation due to the injection of carriers from the former semiconductor element in the on state to the vicinity of the latter element through the semiconductor wafer, in which the base region of each of the plurality of semiconductor elements of each of the first and second groups is common to all of the semiconductor elements of each group and extends to surround the semiconductor elements of each group, in which the common base regions of the first and second groups are partly contiguous to each other, and in which the contiguous common base region has an aperture for coupling the two element groups with each other.

7. A semiconductor device as claimed in claim 5, wherein the common base region has an extending portion between adjacent semiconductor elements and the extending portion has an aperture for coupling adjacent semiconductor elements with each other.

8. A semiconductor device as claimed in claim 7, wherein the extending portion of the common base portion is asymmetrical with respect to a line passing through the center between adjacent semiconductor elements and perpendicular to a line joining adjacent ones of the semiconductor elements.

9. A semiconductor device as claimed in claim 1, wherein the collector region of each of the plurality of semiconductor elements is asymmetrical with respect to a line passing through the center of each emitter region and perpendicular to a line joining adjacent ones of the semiconductor elements.

10. A semiconductor device as claimed in claim 1, which includes a region formed between adjacent semiconductor elements for shortening the lifetime of carriers.

11. A semiconductor device as claimed in claim 1, which includes a region formed to extend around the collector and emitter regions of each of the semiconductor elements for shortening the lifetime of carriers.

12. A semiconductor device as claimed in claim 11, wherein the region for shortening the lifetime of the carriers is asymmetrical passing through the center of either one of the collector and emitter regions and perpendicular to a line joining adjacent ones of the semiconductor elements.

13. A semiconductor device as claimed in claim 1, which includes regions formed at positions between adjacent semiconductor elements for controlling the turnover voltages of the semiconductor elements.

14. A semiconductor device as claimed in claim 7, wherein a region for controlling the turnover voltages of the semiconductor elements is formed at the position of the aperture for coupling the semiconductor elements.

15. A semiconductor device as claimed in claim 1, which includes means for applying light to at least one of the semiconductor elements to lower its turnover voltage to thereby turn on the semiconductor element.

16. A semiconductor device as claimed in claim 1, wherein each of the semiconductor elements consists of the collector, base and emitter regions and a hook region formed in the semiconductor wafer and having the second conductivity type and in which the collector region is formed in the hook region.

17. A semiconductor device as claimed in claim 16, wherein the hook region of each of the semiconductor elements is asymmetrical with respect to a line passing through the center of each emitter region and perpendicular to a line joining adjacent ones of the semiconductor elements.

18. A semiconductor device as claimed in claim 1, in which at least one of the semiconductor elements is responsive to light to thereby turn on the semiconductor element.

* * * * *